United States Patent [19]
Rostoker

[11] Patent Number: 6,081,008
[45] Date of Patent: Jun. 27, 2000

[54] COMPOSITE TRENCH-FIN CAPACITORS FOR DRAM

[75] Inventor: Michael D. Rostoker, Boulder Creek, Calif.

[73] Assignee: LSI Logic Corporation, Milpitas, Calif.

[21] Appl. No.: 08/879,341

[22] Filed: Jun. 20, 1997

Related U.S. Application Data

[62] Division of application No. 08/604,867, Feb. 14, 1996, Pat. No. 5,688,709.

[51] Int. Cl.[7] .......................... H01L 27/108; H01L 29/76; H01L 29/94; H01L 31/119
[52] U.S. Cl. ........................... 257/303; 257/301; 257/296
[58] Field of Search .................................. 257/303, 301, 257/296

[56] References Cited

U.S. PATENT DOCUMENTS

| | | | |
|---|---|---|---|
| Re. 33,261 | 7/1990 | Baglee et al. | 357/23.6 |
| 5,146,425 | 9/1992 | Kang et al. | 365/149 |
| 5,214,296 | 5/1993 | Nakata et al. | |
| 5,217,918 | 6/1993 | Kim et al. | 437/52 |
| 5,234,856 | 8/1993 | Gonzalez | 437/52 |
| 5,455,192 | 10/1995 | Jeon | 437/52 |
| 5,585,303 | 12/1996 | Hong et al. | |

FOREIGN PATENT DOCUMENTS

| | | |
|---|---|---|
| 61-36965 | 2/1986 | Japan . |
| 4267370 | 9/1992 | Japan . |
| 6132495 | 5/1994 | Japan . |

OTHER PUBLICATIONS

"3–Dimensional Stacked Capacitor Cell for 16M and 64M Drams", by T. Ema, S. Kawanago, T. Nishi, S. Yoshida, H. Nishibe, T. Yabu, Y. Kodama, T. Nakano and M. Taguchi; Tachincal Digest, CH2528–8/88/0000–0592, 1988 IEEE.

"A Spread Stacked Capacitor (SCC) Cell For 64Mbit Drams", by S. Inoue, K. Hieda, A. Nitayama, F. Horiguchi and F. Masouka; Technical Digest, CH2637–7/89/000–0031, 1989 IEEE.

"Advanced Cell Structures for Dynamic RAMs", by Nicky C.C. Lu, IEEE Circuits and Devices Magazine, Jan. 1989.

*Primary Examiner*—Stephen D. Meier
*Attorney, Agent, or Firm*—Beyer & Weaver, LLP

[57] ABSTRACT

A semiconductor memory device capacitor is disclosed which has a trench capacitor portion provided in a semiconductor substrate and a fin capacitor portion provided above the substrate. The trench capacitor portion includes (i) a trench extending from an upper surface of the semiconductor substrate downwardly into the substrate, and (ii) an electrically conductive trench electrode provided interior to the trench. And the fin capacitor portion includes (i) a fin electrode having a body portion and two or more electrically conductive fins extending outwardly from the body portion, (ii) a fin dielectric layer conformally coating the two or more electrically conductive fins, and (iii) a cell electrode surrounding and in intimate contact with the two or more electrically conductive fins.

21 Claims, 5 Drawing Sheets

COMPOSITE TRENCH-FIN CAPACITORS FOR DRAM

This is a Divisional application of copending prior application Ser. No. 08/604,867 filed on Feb. 14, 1996, now U.S. Pat. No. 5,688,709.

BACKGROUND OF THE INVENTION

The present invention relates generally to high surface area capacitors for use in dynamic random access memories ("DRAMs"). More particularly, the invention relates to hybrid capacitors having trench and fin components.

In the on-going quest for greater memory density in DRAMs, various memory cell designs have been proposed. Much of the variation in such designs resides in the shape and location of capacitor plates in the memory cell. By way of example, capacitor designs that have been proposed (and in some cases commercialized) include stacked capacitors, spread stacked capacitors, trench capacitors, folded capacitors, and fin capacitors. Memory devices employing such capacitors are described in "Advanced Cell Structures for Dynamic RAMs" by Lu, IEEE Circuits and Devices Magazine, pp. 27–36 (1988); "A Spread Stacked Capacitor (SSC) Cell for 64 MBIT DRAMs" by Inoue et al., IEDM pp. 31–34 (1989); and "3-Dimensional Stacked Capacitor Cell for 16 M and 64 M DRAMs" by Ema et al., IEDM pp. 592–595 (1988).

Trench capacitors have found wide use in commercial high-density DRAMs. Trenches are particularly attractive because they utilize a substrate's third dimension (i.e., the direction normal to the substrate surface), and therefore occupy only very little area on the top surface of the substrate. While other capacitor structures can provide somewhat densely packed devices (e.g., planar and stacked capacitor devices), trench-based structures generally require even less chip area.

While trench capacitors provide space saving advantages, further improvements in device density may require capacitors of increasing storage capacity. This is because each trench capacitor of a DRAM must be capable of storing a certain minimum amount of charge in order to ensure that information is not lost between refresh cycles. Unfortunately, certain engineering obstacles have made it difficult to maintain a fixed level of storage capacity as device sizes and spacing between devices decrease.

The capacitance of a capacitor may be increased in three ways. First, as indicated above, it may be increased by increasing the surface area of the capacitor plates (e.g., the trench walls). Second, it may be increased by increasing the dielectric constant of an insulator separating the plates, and finally, it may be increased by reducing the thickness of the insulator. While some work has focused on engineering trench dielectrics to be thinner or have higher dielectric constants, such efforts are not particularly relevant to the invention described herein.

Some effort has focused on making narrow trench capacitors deeper so as to provide increased surface area. While this approach has yielded some improvements in device density, it is believed that to develop 64 megabit or greater trench-type DRAMs, trenches having submicron widths and aspect ratios of at least about 2.5 to 1 (depth to width) must be formed. However, trench capacitors in current 16 megabit DRAMs produced by Texas Instruments Corporation have widths of about 1.5 $\mu$m and depths of only about 2.85 $\mu$m. Unfortunately, available trench forming techniques have not yet proved able to reliably attain submicron trenches of the depth to width ratios necessary to reach the 64 megabit requirements.

Copending patent applications 08/531,727 entitled "INTEGRATED CIRCUIT DEVICE FABRICATION BY PLASMA ETCHING" and 08/531,473 entitled "INTEGRATED CIRCUIT DEVICE FABRICATION BY PLASMA ETCHING," and 8/531,659 "HIGH SURFACE AREA TRENCHES FOR AN INTEGRATED CIRCUIT DEVICE" all filed on Sep. 21, 1995, and naming M. Rostoker as inventor (all incorporated herein by reference for all purposes) describe improved techniques for forming high surface area trenches for use in trench capacitors. While such techniques represent improvements over the state of the art, it would be highly desirable have other capacitor designs for maintaining the capacitance of trench-type capacitors as device size and spacing decrease.

SUMMARY OF THE INVENTION

The present invention meets the aforementioned need by providing a memory device capacitor having a trench capacitor portion and a fin capacitor portion. By combining a trench capacitor portion below a semiconductor substrate surface and a fin capacitor portion above the surface, considerable improvement is realized in available capacitor surface area for a given substrate surface area.

In one aspect, the present invention provides a semiconductor memory device which may be characterized as including: (1) a semiconductor substrate; (2) a trench capacitor portion provided in the substrate; and (3) a fin capacitor portion provided on the substrate. The trench capacitor portion includes (i) a trench extending from an upper surface of the semiconductor substrate downwardly into the substrate, and (ii) an electrically conductive trench electrode provided interior to the trench. And the fin capacitor portion includes (i) a fin electrode having a body portion and two or more electrically conductive fins extending outwardly from the body portion, (ii) a fin dielectric layer conformally coating the two or more (often at least three) electrically conductive fins, and (iii) a cell electrode surrounding and in intimate contact with the two or more electrically conductive fins.

Preferably, the trench electrode and the fin electrode are electrically coupled such that together they form one electrode of a cell capacitor of the semiconductor memory device. In such devices, capacitor surface area may be increased when the trench electrode includes a cavity extending from the fin electrode downwardly into the trench electrode, with the fin dielectric layer conformally coating the cavity and the cell electrode extending into the cavity. In this manner, the cell electrode forms a second electrode of the cell capacitor with the combined trench/fin electrode forming the other electrode.

In some embodiments, the memory device includes a trench dielectric layer conformally coating the trench and intimately contacting the electrically conductive trench electrode. In some such devices, a portion of the semiconductor substrate adjacent to the trench forms one capacitor electrode of the trench capacitor portion, while the trench electrode forms a counter electrode.

Another aspect of the invention provides an integrated circuit incorporating active devices and capacitors in a semiconductor substrate. The integrated circuit may be characterized as including the following: (1) a plurality of cell capacitors, each having a trench capacitor portion and a fin capacitor portion as described above; and (2) a plurality of active devices arranged in a predefined circuit configuration with at least some of the plurality of trench capacitors. Such integrated circuits of this invention may be DRAMs which incorporate multiple dynamic memory cells, each of which includes a trench capacitor and a pass transistor connected in series. As noted, this invention allows fabrication of DRAMs having a very high density of such memory cells on a single chip. In preferred embodiments, an integrated circuit of this invention includes at least about 1.5 billion dynamic memory cells (and more preferably about 2 billion such cells) on a monocrystalline silicon substrate. In some cases, the integrated circuits of this invention are provided as part of a digital system having a plurality of semiconductor integrated circuits. For example, the system may be multichip memory module.

Yet another aspect of the present invention provides a method of forming a memory cell on a semiconductor substrate. The method may be characterized as including the following steps: (1) forming a transistor on the semiconductor substrate; (2) forming a passivation layer over the transistor; (3) depositing alternating layers of a sacrificial material and a conductive electrode material; (4) etching a trench through the alternating layers and the passivation layer and into the substrate, such that the trench contacts a source region of the transistor; (5) conformally depositing a top layer of the conductive electrode material in the trench and over a top layer of the sacrificial material located outside of the trench; (6) selectively etching to define fin edges of a cell capacitor; (7) etching away the layers of the of sacrificial material to expose fins of the composite trench-fin capacitor; (8) forming a layer of dielectric material on exposed regions of the conductive electrode material; and (9) forming a second electrode surrounding the fins. In a preferred embodiment, the sacrificial material is silicon dioxide, and the step of etching away the layers of the sacrificial material is performed with hydrofluoric acid.

These and other features and advantages of the invention will be described in more detail below with reference to the drawings.

DETAILED DESCRIPTION OF THE PREFERRED EMBODIMENTS

Figure 1:
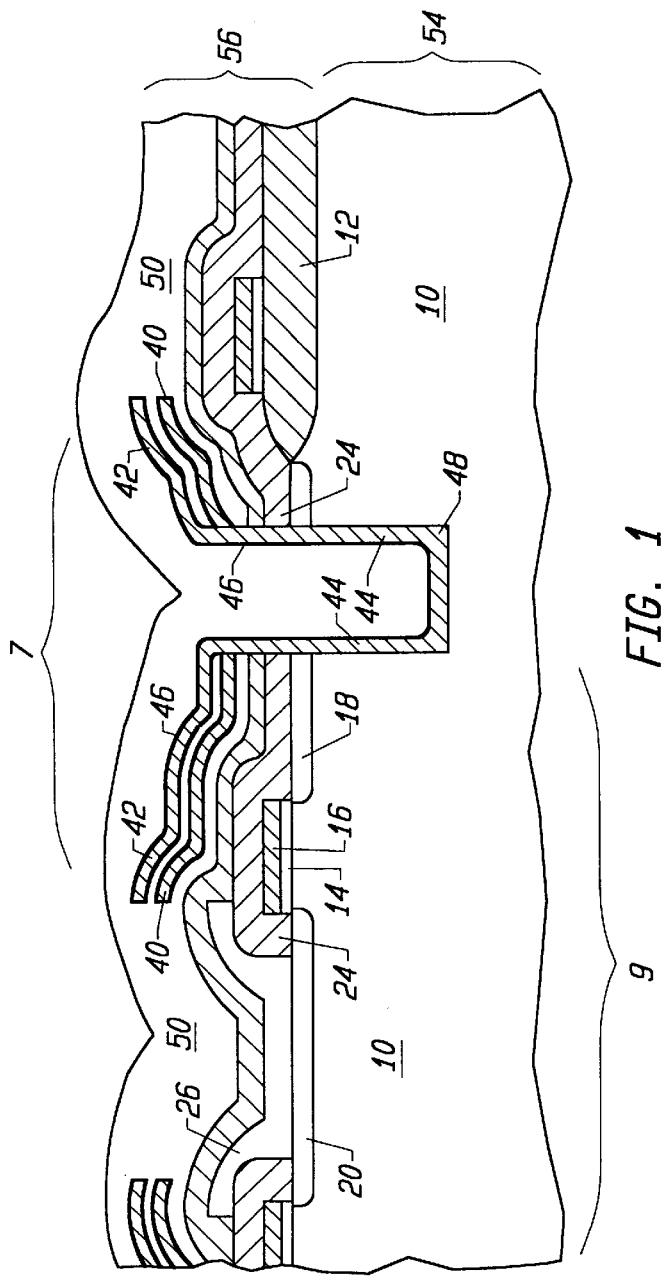
FIG. 1 is a cross-sectional view of a composite trench-fin memory cell in accordance with one embodiment this invention.

FIG. 1 shows a memory cell 5 including an MOS device 9 and a composite trench-fin capacitor 7. As shown, the MOS device 9 includes a gate oxide 14 and a gate electrode (word line) 16 disposed over a channel region in a semiconductor substrate 10. Straddling the channel region are a source region 18 and a drain region 20 formed in substrate 10. A passivation layer 24 covers word line 16 and source 18. A bit line 26 extends through passivation layer 24 and contacts drain 20.

Composite trench-fin capacitor 7 includes a trench region 54 and a fin region 56. A storage plate 44 of the composite capacitor include (1) fins 40 and 42 extending from a body portion which connects with (2) a trench portion 48. The other plate of the composite capacitor is a cell electrode 50 which surrounds fins 40 and 42 and extends into a cavity produced within trench portion 48. Cell electrode 50 is separated from the fin-trench electrode 44 by a thin layer of dielectric 46. Preferably, both cell electrode 50 and trench-fin electrode 40/42/48 are formed of polysilicon. However, other appropriate materials may be substituted therefore. Dielectric layer 46 is preferably silicon dioxide but, may be made from any of a number of other dielectric materials that are compatible with the electrode materials and possess a high dielectric constant. As can be seen, source region 18 is in electrical contact with trench-fin electrode 44.

As should be apparent, the composite capacitor 7 (including fins 40 and 42 as well as the cavity in trench region 54) displayed in FIG. 1 possesses a greater storage surface area than either a conventional trench capacitor or a conventional fin capacitor but still occupies no more surface area than either of these conventional capacitors. Thus, the composite trench/fin capacitor of this invention allows sufficient area for MOS device 9 and the associated bit line 26. Further, the memory cell 5 may be formed by a relatively straight-forward process as described herein.

Figure 2A:
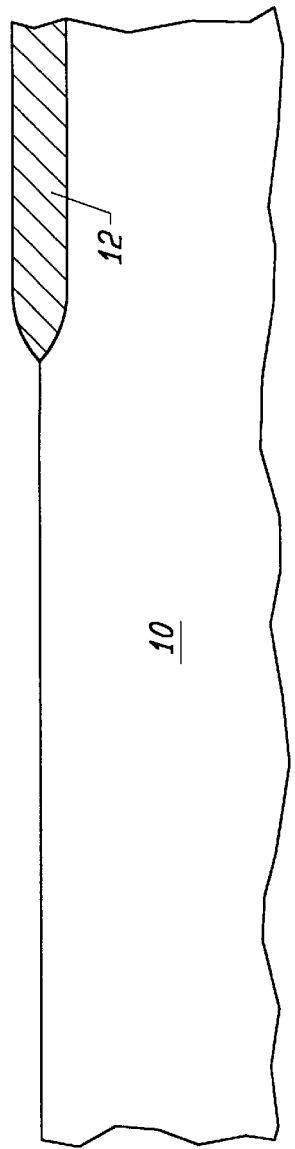
FIGS. 2A to 2M cross-sectional views of a substrate and associated structures at various stages of a process for forming the composite trench-fin memory cell shown in FIG. 1.

A process for preparing the memory cell 5 shown in FIG. 1 is depicted in FIGS. 2A–2M. Initially, an appropriately doped semiconductor substrate 10 is provided with active regions surrounded by field oxide regions 12 as shown in FIG. 2A. Preferably, the substrate 10 is a p-type single crystal silicon wafer, but it may take the form of other materials such as, for example, an epitaxial silicon layer. Field oxide region 12 may be formed by masking the active regions on substrate 10 and then performing a high temperature oxidation of the exposed substrate regions by a conventional process such as local oxidation of silicon (LOCOS).

Figure 2B:
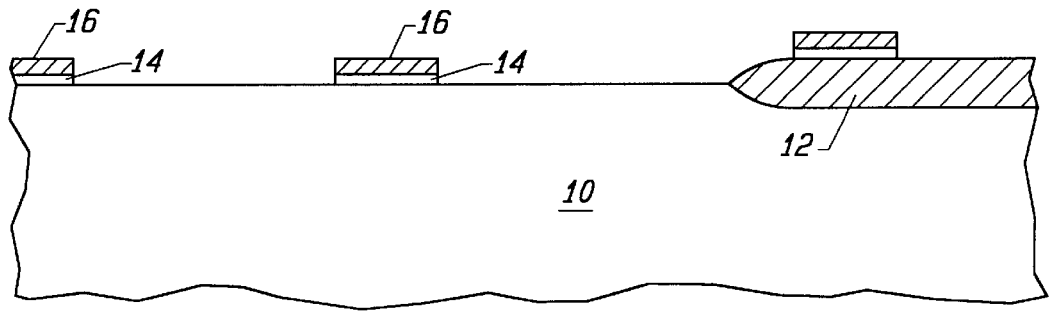

After the field oxide regions have been formed, a thin layer of gate dielectric 14 is conformally deposited over the entire substrate and field oxide structure shown in FIG. 2A. Preferably, this layer is formed by chemical vapor deposition of silicon dioxide or other suitable gate dielectric material. Thereafter, a gate electrode layer 16 is deposited over the gate dielectric layer 14 to a thickness of about 2000 Å, for example. The resulting structure is subsequently patterned in such a manner as to form two gate regions per active region as shown in FIG. 2B. Note that the gate electrodes form word lines in the final DRAM structure.

Figure 2C:
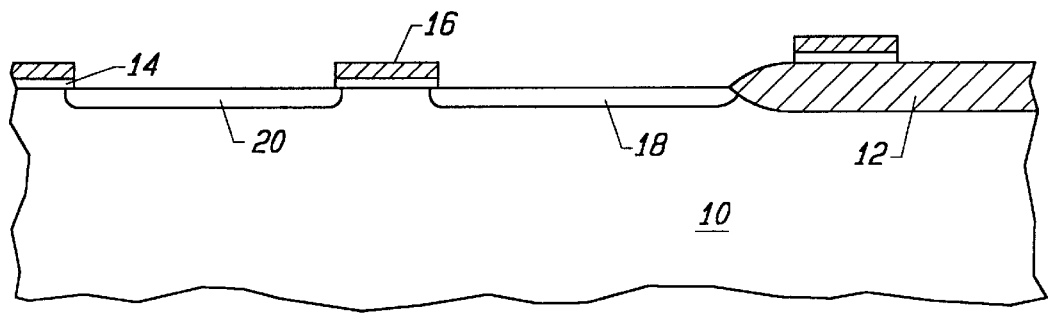

After forming the gates, a first memory cell source region 18 and a common drain region 20 are formed in substrate 10 as shown in FIG. 2C. Preferably, these regions are formed by an arsenic or phosphorous ion implant (at, e.g., a dose of $4 \times 10^{15}$ atoms/cm$^2$ and energy of 40 KeV) and a subsequent anneal. As shown, the implant is self aligned with the previously formed gate regions on substrate 10.

Figure 2D:
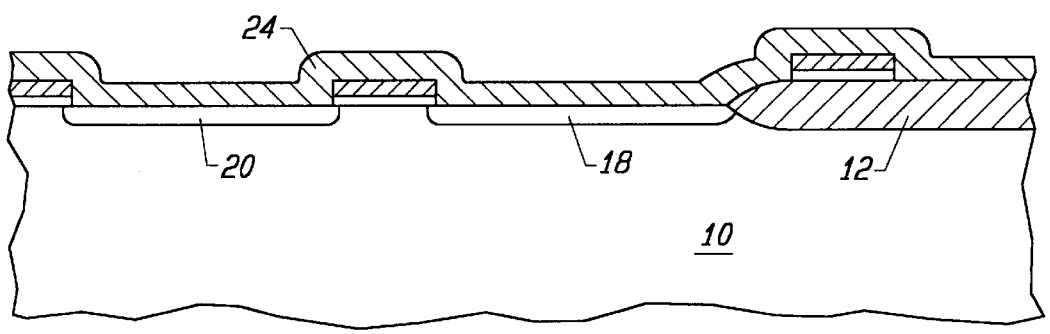

Next, a passivation layer 24 is conformally deposited over the structure shown in FIG. 2C (to a thickness of 1000 Å, for example) in order to form the structure shown in FIG. 2D. Passivation layer 24 is preferably an appropriate insulating material such as an oxide, nitride, glass, (e.g., a phosphoborosilicate), etc. Next, the structure of FIG. 2D is masked and etched to expose a portion of substrate 10 at drain 20. Thereafter, a conductive layer is deposited to a thickness of for example, 500 Å and patterned to form a bit line 26 as shown in FIG. 2E.

Figure 2E:
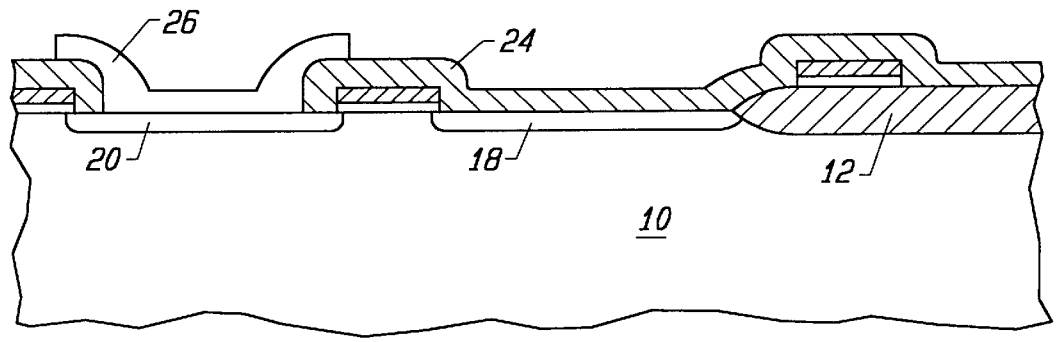
Figure 2F:
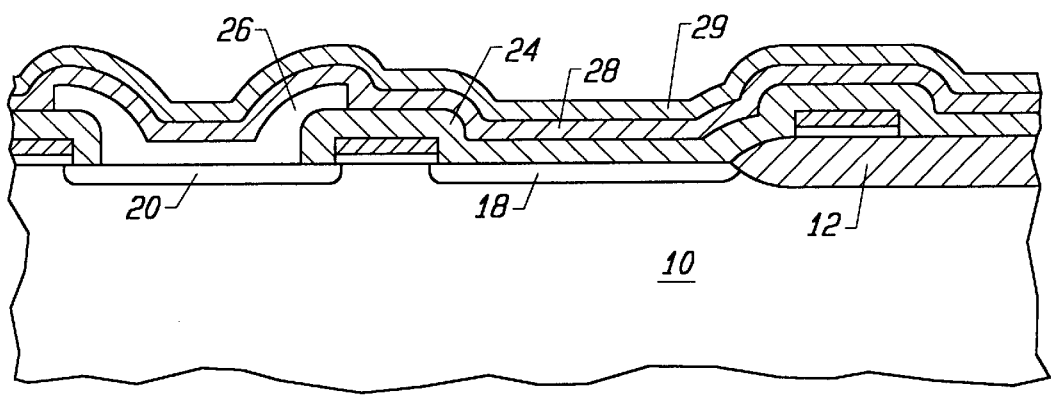

Now, with reference to FIG. 2F, a layer of insulator 28 is conformally deposited to a thickness of about 1000 Å, for example, on the structure of FIG. 2E. Preferably, layer 28 is made from a material that resists etching by standard oxide etchants such as hydrofluoric acid. Silicon nitride is one suitable insulating material. A sacrificial layer 29 is deposited to a thickness of about 1000 Å, for example, over layer 28 to form the structure shown in FIG. 2F. Preferably, layer 29 should be made from a suitable material that can be subsequently etched away (e.g., silicon oxide).

Figure 2G:
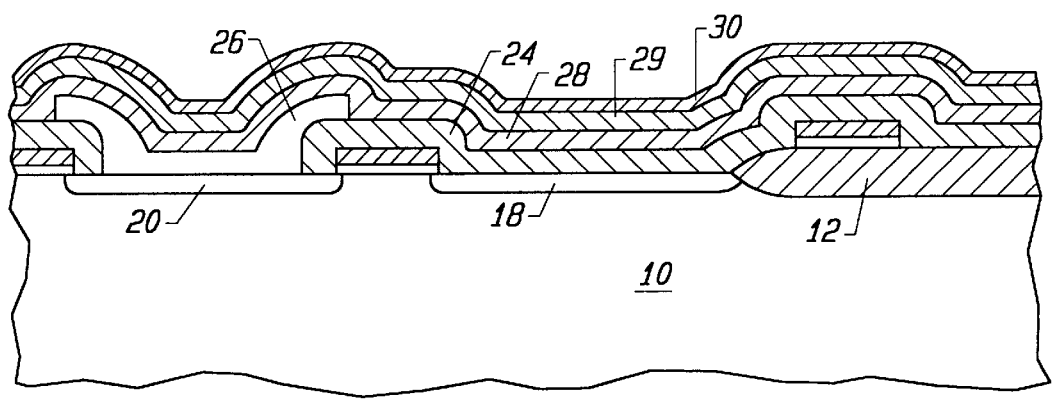
Figure 2H:
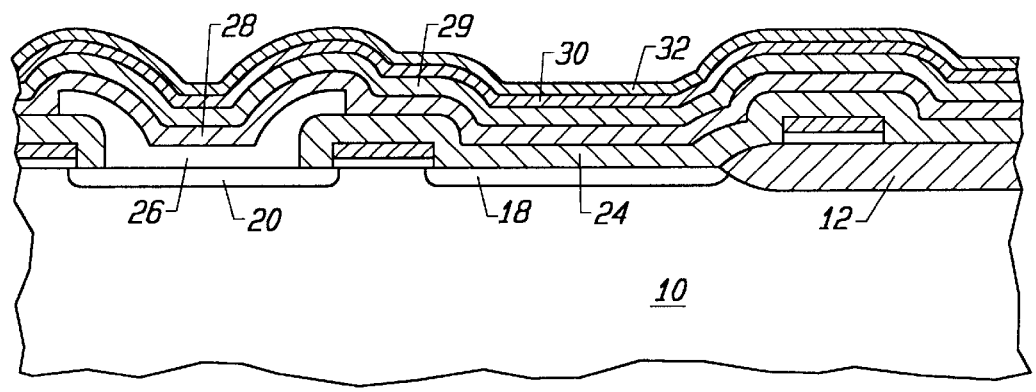
Figure 2I:
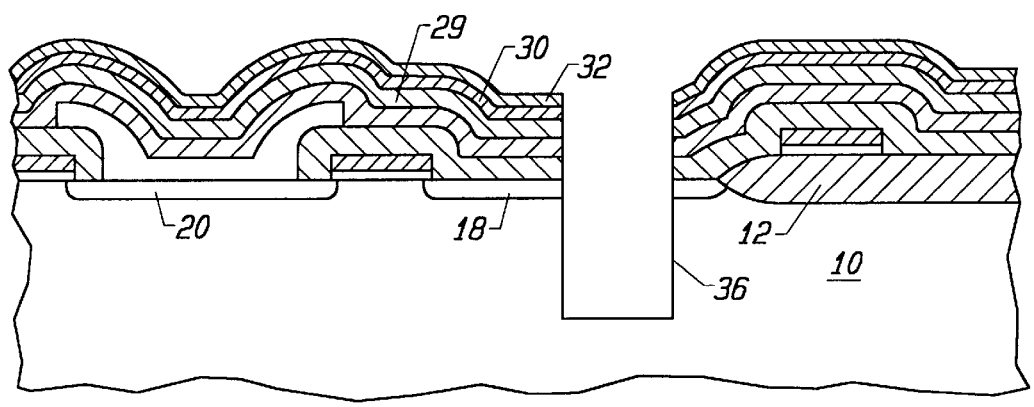

Next, as shown FIG. 2G, a layer of fin electrode material 30 is conformally deposited on top of sacrificial layer 29. Thereafter, as shown in FIG. 2H, a second layer of sacrificial insulator 32 is deposited on top of the fin electrode layer 30. Preferably, layer 30 is made from polysilicon and layer 32 is made from silicon oxide.

After layers 30 and 32 have been deposited, a photoresist layer is provided on the surface of layer 32 and exposed to define trench regions. Thereafter, reactive ion etching (RIE) is carried out to form a trench 36 penetrating layers 32, 30, 29, 28, and 24 and into substrate 10 through source region 18 as shown FIG. 2I. The RIE step to form trench 36 preferably takes place in a three electrode reactor such as one of those described in U.S. Pat. applications Ser. Nos. 08/531,473 and 08/531,727, previously incorporated by reference.

After trench 36 has been formed, a thin silicon dioxide layer (not shown) may be selectively formed on the walls of the trench 36. Regardless of whether such oxide layer is formed, a layer of polysilicon 38 is conformally deposited on the structure so that it covers insulating layer 32 and trench 36 as shown 2J. Note that polysilicon layer 38 forms a cavity 39 within trench 36.

Figure 2J:
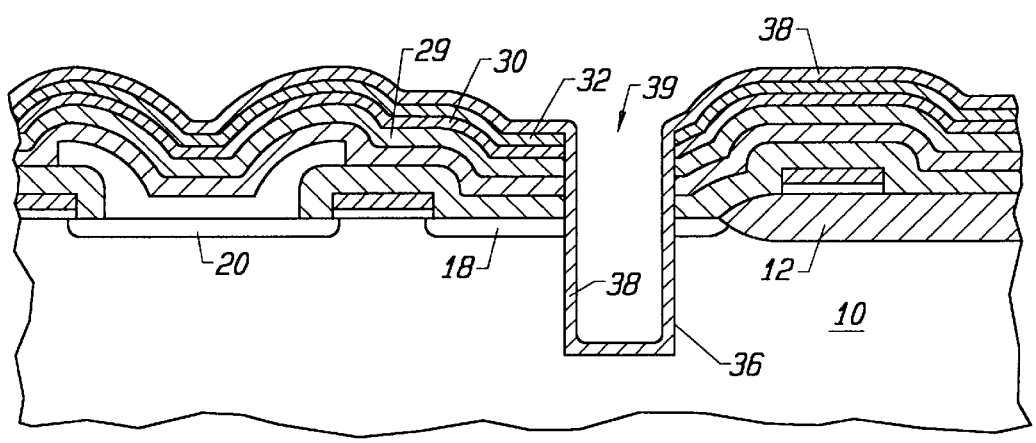

The structure shown FIG. 2J includes a continuous polysilicon region that includes layers 30 and 38. Together, these layers form the material that will ultimately be one plate of a capacitor of this invention. Specifically, layers 38 and 32 flare out, away from trench 36 to form first and second fins of the composite trench-fin capacitor. If three or more fins are to be provided with the composite capacitor, additional alternating layers of polysilicon and sacrificial insulator will be deposited on top of layer 32 before trench 36 is formed. For example, if three fins are desired, then only one additional layer of polysilicon and one additional layer of sacrificial insulator will be formed on top of the structure before the trench is formed. For each additional fin, one additional layer of polysilicon and one additional layer of sacrificial insulator will be added. The final layer of polysilicon is laid down only after trench 36 is formed.

Figure 2K:
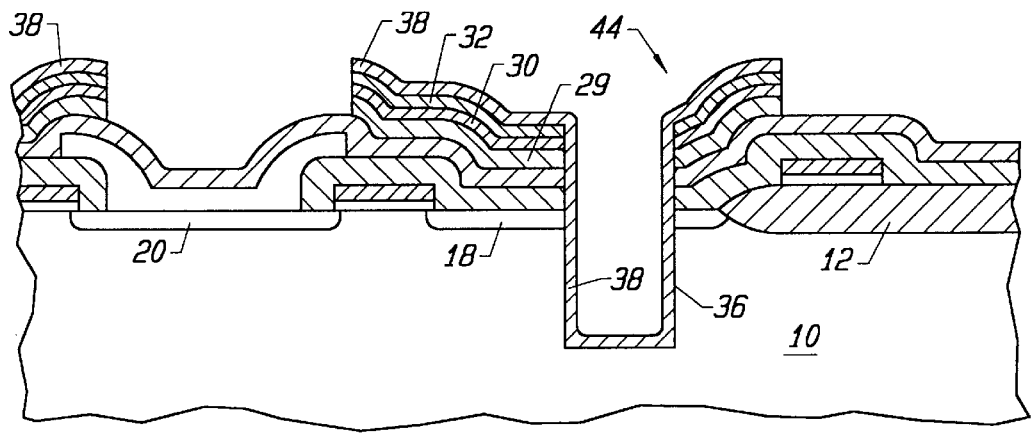
Figure 2L:
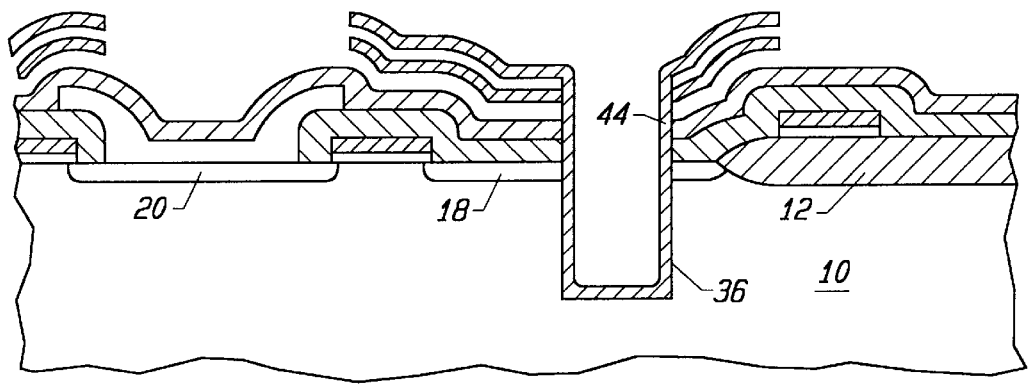

After polysilicon layer 38 has been deposited, the fin edges of the capacitor are defined by masking the appropriate portions of the structure shown in FIG. 2J and then etching down to layer 28 as shown in FIG. 2K. This produces a composite fin-trench storage electrode 44. Next, the sacrificial material provided between the layers of polysilicon in the fin portion of the capacitor is etched away by exposing the structure to an appropriate etchant. Preferably, if the insulator material is silicon dioxide, the etchant is liquid hydrofluoric acid. The resulting structure is shown in FIG. 2L. The composite electrode 44 of this structure may optionally be doped by dipping the structure into $POCl_3$ or other appropriate dopant to diffuse phosphorus or other ion into the polysilicon layer 44.

Figure 2M:
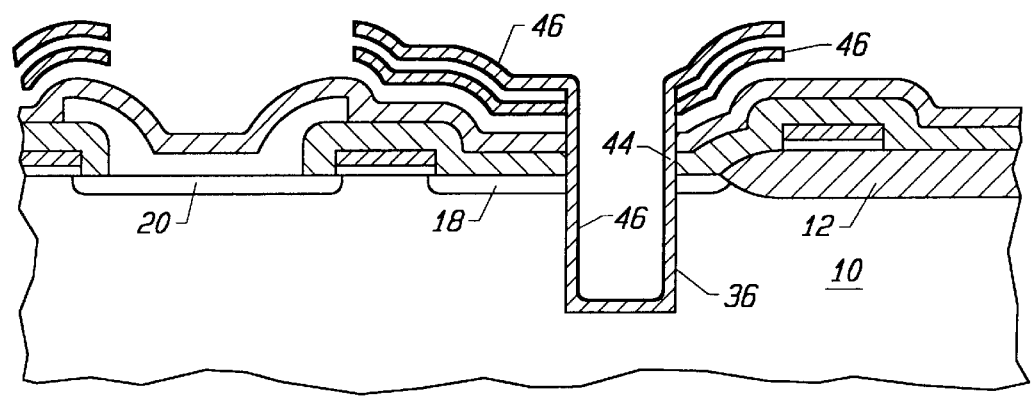

At this point, the exposed portions of the composite trench-fin capacitor plate are coated with a layer of capacitor dielectric 46 such as silicon dioxide or other appropriate material having a high dielectric constant. Preferably, the dielectric layer 46 is formed by chemical vapor deposition under conditions which cause the layer to coat the fins and the cavity inside trench 36 as shown in FIG. 2M.

Finally, a conformal layer of polysilicon 50 is deposited to produce the final structure shown in FIG. 1. As shown, polysilicon layer 50 extends into the regions between fins 40 and 42 and into the cavity provided in the trench portion of the composite trench-fin capacitor. Note that fins 40 and 42 extend over field oxide 12 and bit line 26 to provide additional capacitor surface area above the plane of the memory cell MOS device 9. In alternative embodiments, the layer 50 is patterned and etched to form smaller cell electrodes—one associated with each composite trench-fin storage electrode.

In the embodiments described above, the composite trench-fin electrode 44 constituted the storage electrode while the polysilicon region 50 constituted the counter electrode of a memory cell capacitor. In other embodiments of this invention, alternate electrode arrangements may be employed. For example, the substrate itself can form a storage electrode in the manner of many conventional trench capacitor RAM cells. In such embodiments, the composite trench-fin electrode is the capacitor's fixed potential electrode, and the source region should be insulated from the trench-fin electrode. In an alternate embodiment, the substrate may be conductively coupled to a polysilicon region surrounding the capacitor fins (such as electrode 50 shown in FIG. 1) so that the substrate and the polysilicon electrode together form a storage electrode. Because the polysilicon layer surrounding the fins of the capacitor electrode acts as part of the storage electrode and its potential may vary from cell to cell, the layer should be divided into separate electrodes, one for each capacitor (unlike the continuous layer 50 shown in FIG. 1). The polysilicon layer and substrate can be conductively coupled by vias at appropriate locations.

As noted, a memory cell of this invention typically includes a composite trench-fin capacitor and a pass transistor connected in series. Multiple such memory cells are arranged in a predefined circuit configuration to form the DRAM. Specifically, in each cell, the transistor's gate is connected to a word line, one transistor drain/source is connected to a first plate of the composite capacitor (e.g., the semiconductor substrate), and the other drain/source is connected to a bit line. In accordance with this invention, such cells may be formed on a single chip capable of storing at least one gigabit of data. For example, using trench-fin capacitors of this invention, a 1.5–2 gigabit DRAM could be provided on a single monocrystalline silicon chip. In some cases, the DRAMs or other integrated circuits prepared in accordance with this invention are provided as part of a digital system having a plurality of semiconductor integrated circuits. For example, the system may be multichip memory module.

Although a few preferred embodiments of the present invention have been described in detail, it should be understood that the present invention may be embodied in many other specific forms without departing from the spirit or scope of the invention. Particularly, it should be understood that the exact sizing, shaping, and placement of the fins and trenches of a composite capacitor may be widely varied within the scope of the present invention. Further, the exact materials provided to form the trench-fin and cell electrodes can be varied within the scope of this invention. Therefore, the present embodiments are to be considered as illustrative and not restrictive, and the invention is not to be limited to the details given herein, but may be modified within the scope of the appended claims.

What is claimed is:

1. A semiconductor memory device comprising:

a semiconductor substrate having an upper surface;

a trench capacitor portion provided in said substrate and including a trench extending from said upper surface downwardly into said semiconductor substrate, and an electrically conductive trench electrode provided interior to said trench; and a fin capacitor portion provided on said substrate and including a fin electrode having a body portion and two or more electrically conductive fins extending outwardly from said body portion, a fin dielectric layer conformally coating said two or more electrically conductive fins, and a cell electrode surrounding and in intimate capacitive contact with said two or more electrically conductive fins.

2. The semiconductor memory device of claim 1, wherein said trench electrode and said fin electrode are conductively coupled and together form one electrode of a cell capacitor of said semiconductor memory device.

3. The semiconductor memory device of claim 2, wherein said trench electrode includes a cavity extending from said fin electrode downwardly into said trench electrode, and wherein said fin dielectric layer conformally coats said cavity.

4. The semiconductor memory device of claim 3, wherein said cell electrode extends downwardly into said cavity, such that the cell electrode forms a second electrode of said cell capacitor of said semiconductor memory device.

5. The semiconductor memory device of claim 1, further comprising a trench dielectric layer conformally coating said trench and intimately contacting said electrically conductive trench electrode.

6. The semiconductor memory device of claim 5, wherein a portion of said semiconductor substrate adjacent to said trench forms one capacitor electrode of said trench capacitor portion, and wherein said trench electrode forms a counter electrode of said trench capacitor portion.

7. The semiconductor memory device of claim 1 wherein the fin capacitor portion includes three or more electrically conductive fins.

8. An integrated circuit incorporating active devices and capacitors in a semiconductor substrate having an upper surface, the integrated circuit comprising:

a plurality of cell capacitors, each including (a) a trench capacitor portion provided in said substrate and having (i) a trench extending from said upper surface downwardly into said semiconductor substrate, and (ii) an electrically conductive trench electrode provided interior to said trench; and (b) a fin capacitor portion provided on said substrate and having (i) a fin electrode having a body portion and two or more electrically conductive fins extending outwardly from said body portion, (ii) a fin dielectric layer conformally coating said two or more electrically conductive fins, and (iii) a cell electrode surrounding and in intimate capacitive contact with said two or more electrically conductive fins; and a plurality of active devices arranged in a predefined circuit configuration with at least some of said plurality of cell capacitors.

9. The integrated circuit of claim 8 wherein the integrated circuit is a dynamic random access memory comprised of dynamic memory cells, each of which includes one of said cell capacitors and a pass transistor connected in series.

10. The integrated circuit of claim 9 wherein the integrated circuit includes at least about 1.5 billion dynamic memory cells on said semiconductor substrate which semiconductor substrate is monocrystalline silicon.

11. The integrated circuit of claim 10 wherein the integrated circuit includes at least about 2 billion dynamic memory cells on said semiconductor substrate which semiconductor substrate is monocrystalline silicon.

12. The integrated circuit of claim 8, wherein said trench electrode and said fin electrode are electrically coupled and together form one cell electrode of each cell capacitor.

13. The integrated circuit of claim 12, wherein said trench electrode includes a cavity extending from said fin electrode downwardly into said trench electrode, and wherein said fin dielectric layer conformally coats said cavity.

14. The integrated circuit of claim 13, wherein said cell electrode extends downwardly into said cavity, such that the cell electrode forms a second electrode of each cell capacitor.

15. The integrated circuit of claim 8, further comprising a trench dielectric layer conformally coating said trench and intimately contacting said electrically conductive trench electrode.

16. The integrated circuit of claim 15, wherein a portion of said semiconductor substrate adjacent to said trench forms one capacitor electrode of said trench capacitor portion, wherein said trench electrode forms a counter electrode of said trench capacitor portion.

17. A digital system having a plurality of semiconductor integrated circuits, each incorporating active devices and cell capacitors in a semiconductor substrate having an upper surface, the digital system integrated circuits each comprising:

a plurality of cell capacitors, each including (a) a trench capacitor portion provided in said substrate and having (i) a trench extending from said upper surface downwardly into said semiconductor substrate, and (ii) an electrically conductive trench electrode provided interior to said trench; and (b) a fin capacitor portion provided on said substrate and having (i) a fin electrode having a body portion and two or more electrically conductive fins extending outwardly from said body portion, (ii) a fin dielectric layer conformally coating said two or more electrically conductive fins, and (iii) a cell electrode surrounding and in intimate capacitive contact with said two or more electrically conductive fins; and a plurality of active devices arranged in a predefined circuit configuration with at least some of said plurality of capacitors.

18. The digital system of claim 17 wherein the integrated circuits are DRAMs and the digital system is a multichip memory module.

19. The integrated circuit of claim 17, wherein said trench electrode and said fin electrode are electrically coupled and together form one cell electrode of each cell capacitor.

20. The integrated circuit of claim 19, wherein said trench electrode includes a cavity extending from said fin electrode downwardly into said trench electrode, and wherein said fin dielectric layer conformally coats said cavity.

21. The digital system of claim 17 wherein at least one of the integrated circuits includes at least about 1.5 billion dynamic memory cells on said semiconductor substrate which semiconductor substrate is monocrystalline silicon.

\* \* \* \* \*